US011251043B2

(12) United States Patent
Fan et al.

(10) Patent No.: US 11,251,043 B2
(45) Date of Patent: Feb. 15, 2022

(54) METHOD AND STRUCTURE FOR CUTTING DENSE LINE PATTERNS USING SELF-ALIGNED DOUBLE PATTERNING

(71) Applicant: Yangtze Memory Technologies Co., Ltd., Hubei (CN)

(72) Inventors: Lu Ming Fan, Hubei (CN); Zi Qun Hua, Hubei (CN); Bi Feng Li, Hubei (CN); Qingchen Cao, Hubei (CN); Yaobin Feng, Hubei (CN); Zhiliang Xia, Hubei (CN); Zongliang Huo, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 33 days.

(21) Appl. No.: 16/909,510

(22) Filed: Jun. 23, 2020

(65) Prior Publication Data

US 2020/0321215 A1   Oct. 8, 2020

Related U.S. Application Data

(60) Division of application No. 16/183,174, filed on Nov. 7, 2018, now Pat. No. 10,727,056, which is a
(Continued)

(30) Foreign Application Priority Data

Nov. 23, 2017   (CN) .......................... 201711183484.8

(51) Int. Cl.
*H01L 21/461* (2006.01)
*H01L 21/033* (2006.01)
(Continued)

(52) U.S. Cl.
CPC .... *H01L 21/0332* (2013.01); *H01L 21/76816* (2013.01); *H01L 21/76892* (2013.01);
(Continued)

(58) Field of Classification Search
CPC ............. H01L 21/0332; H01L 21/0337; H01L 21/76816; H01L 21/76892; H01L 27/11551; H01L 27/11578
(Continued)

(56) References Cited

U.S. PATENT DOCUMENTS 8,637,982 B2 * 1/2014 Ogisu ............... H01L 21/76885
257/734
8,759,224 B2   6/2014 Kim et al.
(Continued)

FOREIGN PATENT DOCUMENTS

CN   102376566 A   3/2012
CN   103474339 A   12/2013
(Continued)

OTHER PUBLICATIONS

International Search Report and Written Opinion of the International Searching Authority directed to related International Patent Application No. PCT/CN2018/111834, dated Feb. 1, 2019; 6 pages.
(Continued)

*Primary Examiner* — Luan C Thai
(74) *Attorney, Agent, or Firm* — Sterne, Kessler, Goldstein & Fox P.L.L.C.

(57) ABSTRACT

A method for forming a semiconductor structure including forming a plurality of mandrel lines on a first dielectric layer and forming one or more groups of discontinuous mandrel line pairs with a first mask. The method further includes disposing a second dielectric layer, and forming dielectric spacers on sidewalls of the mandrel lines and the discontinuous mandrel line pairs. The method further includes removing the mandrel lines and the discontinuous mandrel line pairs to form spacer masks, forming one or more groups of blocked regions using a second mask, and forming openings extended through the first dielectric layer with a
(Continued)

conjunction of the spacer masks and the second mask. The method also includes removing the spacer masks and the second mask, disposing an objective material in the openings, and forming objective lines with top surfaces coplanar with the top surfaces of the first dielectric layer.

20 Claims, 11 Drawing Sheets

Related U.S. Application Data continuation of application No. PCT/CN2018/111834, filed on Oct. 25, 2018.

(51) Int. Cl.
*H01L 21/768* (2006.01)
*H01L 27/11578* (2017.01)
*H01L 27/11551* (2017.01)

(52) U.S. Cl.
CPC ..... *H01L 21/0337* (2013.01); *H01L 27/11551* (2013.01); *H01L 27/11578* (2013.01)

(58) Field of Classification Search
USPC .................................. 438/717, 725
See application file for complete search history.

(56) References Cited

U.S. PATENT DOCUMENTS

| | | |
|---|---|---|
| 9,263,323 B2 | 2/2016 | Sonoda |
| 9,741,615 B1 | 8/2017 | Zang et al. |
| 9,818,875 B1 | 11/2017 | Bi et al. |
| 10,256,096 B2 | 4/2019 | Huang et al. |
| 2008/0017996 A1 | 1/2008 | Sato et al. |
| 2014/0248773 A1 | 9/2014 | Tsai |
| 2014/0346677 A1 | 11/2014 | Sonoda |
| 2017/0221760 A1 | 8/2017 | Smith et al. |
| 2017/0243818 A1 | 8/2017 | Aburada et al. |
| 2019/0157082 A1 | 5/2019 | Fan et al. |

FOREIGN PATENT DOCUMENTS

| | | |
|---|---|---|
| CN | 104022021 A | 9/2014 |
| CN | 105321874 A | 2/2016 |
| JP | 5667240 B2 | 2/2015 |

OTHER PUBLICATIONS

Third Office Action filed in CN201880005356, filed Apr. 23, 2020; 13 pages.

* cited by examiner

METHOD AND STRUCTURE FOR CUTTING DENSE LINE PATTERNS USING SELF-ALIGNED DOUBLE PATTERNING

CROSS-REFERENCE TO RELATED APPLICATIONS AND INCORPORATION BY REFERENCE

This application is a divisional of U.S. Non-provisional patent application Ser. No. 16/183,174 filed on Nov. 7, 2018 and titled "Method and Structure for Cutting Dense Line Patterns using Self-Aligned Double Patterning," now U.S. Pat. No. 10,727,056 issued on Jul. 28, 2020, which claims priority to PCT/CN2018/111834 filed on Oct. 25, 2018, which claims priority to Chinese Patent Application No. 201711183484.8, filed on Nov. 23, 2017. The entire contents of these applications are incorporated herein by reference in their entirety.

TECHNICAL FIELD

The present disclosure generally relates to the field of semiconductor technology, and more particularly, to a method for forming a three-dimensional (3D) memory.

BACKGROUND

Planar memory cells are scaled to smaller sizes by improving process technology, circuit design, programming algorithm, and fabrication process. However, as feature sizes of the memory cells approach a lower limit, planar process and fabrication techniques become challenging and costly. As such, memory density for planar memory cells approaches an upper limit. A three-dimensional (3D) memory architecture can address the density limitation in planar memory cells.

BRIEF SUMMARY

Embodiments of a method for cutting dense line patterns using self-aligned double patterning for a three-dimensional (3D) memory are described in the present disclosure.

In some embodiments, a method for cutting dense line patterns for page buffers in a 3D memory periphery using self-aligned double patterning (SADP) is described. The method includes exposing a portion of two adjacent mandrel lines of a page buffer using a first mask designed with optical proximity correction (OPC), removing the portion and forming two discontinuous mandrel line pairs. The method also includes disposing a dielectric layer over the mandrel lines of the page buffer and forming dielectric spacers along the sidewalls of mandrel lines. The method further includes removing the mandrel lines selectively over the dielectric spacers. The method also includes blocking a portion of the dielectric spacers using a second mask, disposing a conductive layer and forming conductive lines in between the dielectric spacers that are not blocked by the second mask.

In some embodiments, the conductive layer includes a discontinuous pattern across three adjacent conductive lines.

In some embodiments, the dielectric layer includes silicon oxide, silicon nitride, silicon oxynitride, and/or combinations thereof.

In some embodiments, the disposing of the conductive layer includes physical vapor deposition (PVD), atomic layer deposition (ALD), and chemical vapor deposition (CVD).

In some embodiments, the conductive layer includes metal or doped silicon.

In some embodiments, the method for cutting dense line patterns for page buffers in the 3D memory periphery using SADP further includes a planarization process to from conductive layers coplanar with patterned structures on the wafer.

In some embodiments, the metal used for conductive layer includes tungsten, cobalt, copper, and aluminum.

In some embodiments, the number of line patterns formed by the dielectric spacers is twice the number of the mandrel lines. Two pairs of dielectric spacer lines along the two discontinuous mandrel line pairs are also discontinuous at the corresponding locations. There are two dielectric spacer cross-bars connecting the discontinuous dielectric spacer lines within each pair. The second mask blocks the central space between the two pairs of discontinuous dielectric spacer lines. Two ends of the second mask extend along the two pairs of dielectric spacers, covering the space in between them.

In some embodiments, the second mask includes a width no more than the distance between the outer edges of the two center dielectric spacers. The second mask also includes a width no less than the distance between the inner edges of the two center dielectric spacers.

In some embodiments, a 3D NAND memory chip can include a page buffer with cutting patterns formed by SADP using any one of the processes stated above.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
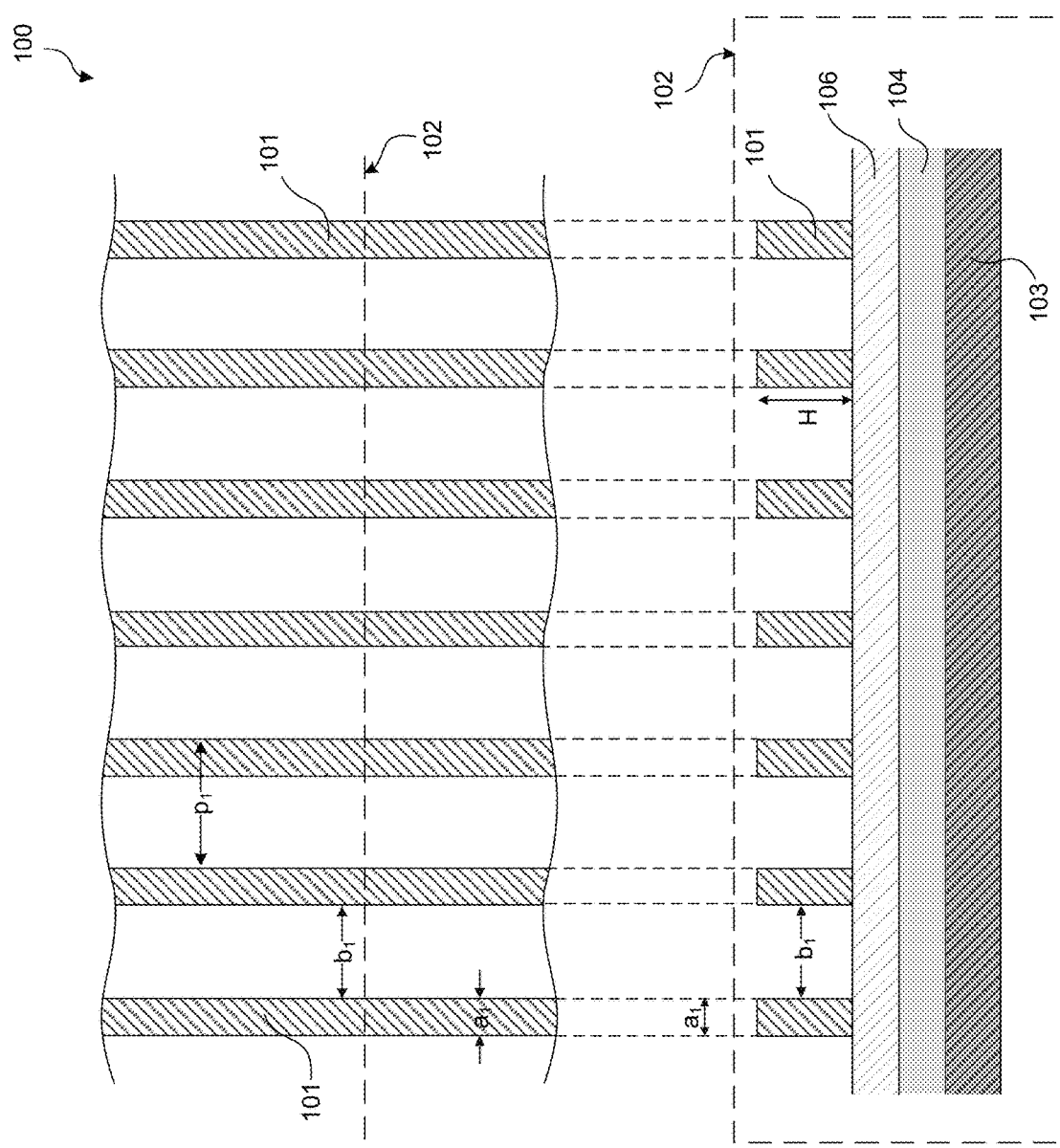
FIG. 1 illustrates an example of top-down and cross-sectional views of a semiconductor structure with a plurality of mandrel lines formed on a first dielectric layer, in accordance with some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a top surface and a bottom surface. The top surface of the substrate is where a semiconductor device is formed, and therefore the semiconductor device is formed at a top side of the substrate. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate. In the present disclosure, the term "each" may not only necessarily mean "each of all," but can also mean "each of a subset."

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

In some embodiments, a NAND string or a 3D memory includes a semiconductor pillar (e.g., silicon channel) that extends vertically through a plurality conductor/dielectric layer pairs. The plurality of conductor/dielectric layer pairs are also referred to herein as an "alternating conductor/dielectric stack." An intersection of the conductor layer and the semiconductor pillar can form a memory cell. The conductor layer of the alternating conductor/dielectric stack can be connected to a word line at back-end-of-line, where a word line can electrically connect one or more control gates. The top of the semiconductor pillar (e.g., transistor drain region) can be connected to a bit line (electrically connecting one or more semiconductor pillars). Word lines and bit lines are typically laid perpendicular to each other (e.g., in rows and columns, respectively), forming an array of the memory. A memory chip may have one or more array blocks or banks. An array bank can also be divided into smaller array segments. Array is the core area performing storage function in a memory chip. To achieve higher bit density, the number of 3D memory stacks is increased greatly, adding complexity and cost in manufacturing.

A memory chip has another part, called periphery, that provides supporting functions to the core. Periphery includes many digital, analog, and/or mixed-signal circuits, for example, row and column decoders, drivers, page buffers, sense amplifiers, timing and controls. Peripheral circuits use active and/or passive semiconductor devices, such as transistors, diodes, capacitors, resistors, etc.

To reduce cost per bit, the dimensions of critical features for semiconductor devices are aggressively scaled down. Advanced lithography has provided smaller critical dimensions using illumination source with shorter wavelength, for example, deep ultraviolet (DUV) laser at 193 nm. To reduce diffraction when the minimum dimensions becomes a fraction of the 193 nm wavelength, reticle enhancement techniques are used, for example phase-shift mask and optical-proximity correction (OPC), in addition to optical equipment improvements, for example, lenses with higher numerical apertures, immersion techniques, off-axis illumination and/or the use of multiple sources. Computational lithography and design rule restrictions (for example, limiting bidirectional features, etc.) can further enhance patterning capability using existing lithography systems. Before extreme ultraviolet (EUV) technology is commercially viable, double patterning is a technique enabling manufacturing on sub-30 nm process nodes. Double patterning splits dense patterns into two interleaved patterns of less-dense features using two lithography masks and a litho-etch, litho-etch (LELE) process. The main issue of double patterning is the misalign of these two lithography levels. An alternative technique such as self-aligned double patterning (SADP) or spacer-assisted double patterning can provide finer pitches.

Self-aligned double patterning (SADP) uses a material wrapping around a source element (also called "mandrel") that is defined by a lithography mask. Using sidewall image transfer, metal that fills in between the spacers can form a metal line. Critical features of SADP are determined by the spacers surrounding the source element and not directly by any features on the mask. The remaining design features can be achieved using a cut mask.

It is desirable to design the lines straight and of equal width and/or spacing on critical, lower metal layers such as metal one (M1) and metal two (M2) as well as local interconnect and gate metals. At these levels, pattern density can be further increased through layout design and a cut mask. For example, at M2 level in a page buffer of a 3D memory periphery, low-voltage and high voltage bit lines can share the same metal lines on an M2 mask and can be separated using a cut mask in the subsequent processes. Therefore it is desirable to have a reliable technique that can cut dense patterns using SADP.

Various embodiments in the present disclosure provide methods and structures for cutting dense line patterns for metal interconnects in a 3D memory. Dense lines are usually cut with a single mask. One or more groups of dense lines can be cut in a group of three using a plurality of staggered shapes, each shape having an offset of a line pitch. As the line pitch goes below 50 nm, alignment between cutting shapes and dense metal lines becomes very difficult with tolerance of a single pitch. In the present disclosure, a first cutting mask can be used to cut mandrel lines at larger pitch and a second cutting mask can be used to further separate dense features with relaxed alignment tolerance. Although metal line patterning is described in this disclosure as an example, the disclosed methods and structures can be used for patterning dense lines in chip design and manufacturing in general.

FIG. 1 illustrates a schematic top-down (top) and cross-sectional views (bottom) of an exemplary semiconductor structure 100 according to some embodiments, wherein the semiconductor structure 100 having a plurality of mandrel lines 101. The mandrel lines 101 have a width of "$a_1$" and a spacing of "$b_1$." In some embodiments, the mandrel lines 101 can have different width and spacing. For illustration purpose, the mandrel lines 101 of the same width "$a_1$" and the same spacing "$b_1$" are used herein for simplicity. A pitch "$p_1$" of the mandrel lines (also called line pitch) refers to a repeating period, e.g., the distance from one edge of a mandrel line to a corresponding edge of an adjacent mandrel line. The pitch "$p_1$" is equivalent to a sum of "$a_1$" and "$b_1$." The width "$a_1$" can be a dimension in between about 5 nm to 40 nm, about 10 nm to about 35 nm, about 15 nm to about 30 nm, about 19 nm to about 29 nm, or the like. The spacing "$b_1$" can be a dimension in between about 15 nm to 120 nm, about 30 nm to about 95 nm, about 45 nm to about 90 nm, about 30 nm to about 60 nm, or the like. The pitch "$p_1$" of the mandrel lines can be a dimension in between about 20 nm to 160 nm, about 40 nm to about 140 nm, about 60 nm to about 120 nm, about 49 nm to about 89 nm, or the like.

A cross-sectional view of the semiconductor structure 100 along line 102 is shown at the bottom of FIG. 1. The semiconductor structure 100 includes a substrate 103, an insulating layer 104, a first dielectric layer 106 and the plurality of mandrel lines 101 disposed on top of the first dielectric layer 106.

In some embodiments, the substrate 103 used for the semiconductor structure 100 includes any suitable material for supporting the structure. For example, the substrate 103 can include silicon, silicon germanium (SiGe), silicon carbide, silicon on insulator (SOI), germanium on insulator (GOI), glass, gallium nitride, gallium arsenide, etc., and/or combinations thereof. In some embodiments, the substrate 103 can further include semiconductor devices, for example, metal oxide semiconductor field effect transistors (MOSFETs), diodes, resistors, capacitor, inductors, etc., fabricated on top of the semiconductor material described herein.

The insulating layer 104 is disposed on top of the substrate 103 and can include silicon oxide, silicon nitride, silicon oxynitride, and/or high-k dielectric films such as hafnium oxide, zirconium oxide, aluminum oxide, tantalum oxide, magnesium oxide, or lanthanum oxide films, and/or combinations thereof. The insulating layer 104 can be disposed using techniques such as chemical vapor deposition (CVD), physical vapor deposition (PVD), plasma-enhanced CVD (PECVD), low pressure chemical vapor deposition (LPCVD), high density plasma (HDP) chemical vapor deposition, rapid thermal chemical vapor deposition (RTCVD), metal organic chemical vapor deposition (MOCVD), atomic layer deposition (ALD), sputtering, thermal oxidation or nitridation, CVD using a furnace system, any other suitable deposition method, and/or combinations thereof.

The first dielectric layer 106 is disposed on top of the insulating layer 104 and can include any suitable insulators that is different from the insulating layer 104, for example, silicon oxide, silicon nitride, silicon oxynitride, TEOS, spin-on-glass, boron or phosphorus doped silicon oxide, etc., and/or combinations thereof. The formation of the first dielectric layer 106 can include any suitable deposition methods such as CVD, PVD, PECVD, LPCVD, RTCVD, high-density-plasma (HDP) CVD, CVD using a furnace system, sputtering, spin-on coating, etc., and/or combinations thereof. In some embodiments, forming of the first dielectric layer 106 can also include a planarization process, such as chemical mechanical polishing (CMP), to form a planar surface.

The forming of the mandrel lines 101 includes disposing a sacrificial material on top of the first dielectric layer 106 and patterning the sacrificial material. The sacrificial material used for the mandrel lines 101 can be any suitable dielectric material, such as silicon oxide, silicon nitride, silicon oxynitride, and/or combinations thereof. The sacrificial material used for mandrel lines 101 can also be any suitable semiconductor material, such as amorphous or polycrystalline silicon or silicon germanium. The disposing of the sacrificial material includes techniques such as CVD, PVD, PECVD, LPCVD, RTCVD, high-density-plasma (HDP) CVD, CVD using a furnace system, sputtering, spin-on coating, etc., and/or combinations thereof. The sacrificial material includes a thickness "H" in a range between 10 nm to 1000 nm. The thickness "H" of the sacrificial material determines the height of mandrel lines 101.

The patterning of the sacrificial material to form a plurality of the mandrel lines 101 includes a lithography process followed by an etching process, wherein the lithography and etching processes are known to those skilled in the art and are included herein for entirety. The lithography process can include short wavelengths of light such as deep ultraviolet of 248 nm or 193 nm. The lithography process can also include 193 nm immersion process. The lithography process can further include a phase-shifting photomask and/or a photomask with optical proximity correction. In addition to photoresist, anti-reflective coatings can be used to improve lithography quality and reduce minimum feature size. The etching of the sacrificial material can also include a hard mask in addition to photoresist. The hard mask can be another polymer, a dielectric material, or combinations thereof. The etching process can include a dry etching, such as reactive-ion-etching (RIE). The etching process can also include a trimming step (e.g., laterally etching the photoresist and/or the hard mask) prior to etching the sacrificial material to further shrink the width "$a_1$" of the mandrel lines 101. In some embodiments, the mandrel line 101 includes a straight sidewall, i.e. perpendicular to a top surface of the substrate 103. Straight sidewalls provide advantages of dimensional control of the width "$a_1$," the spacing "$b_1$" and the pitch "$p_1$" of the mandrel lines 101 in multiple dense line patterning.

Figure 2:
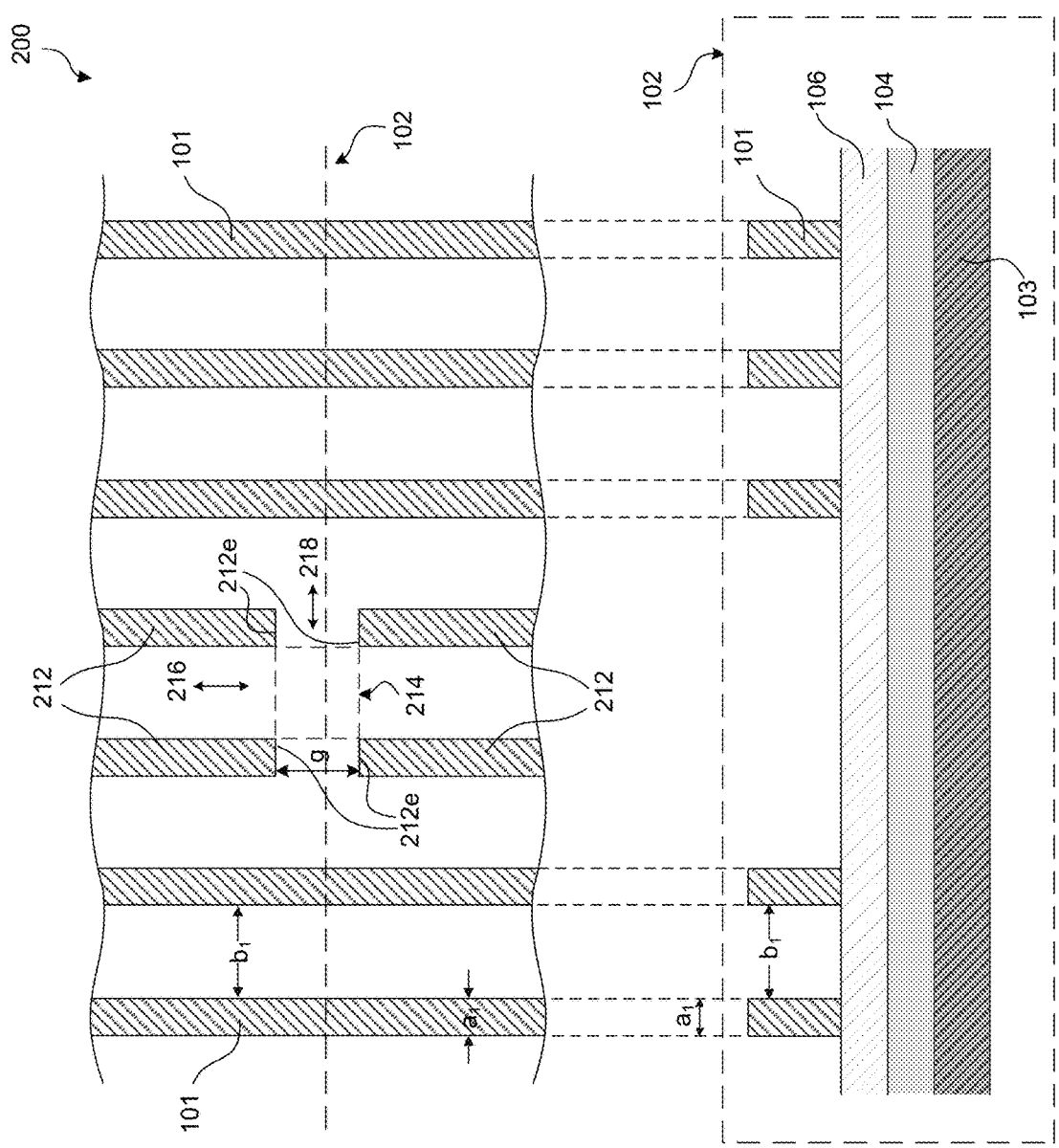
FIG. 2 illustrates an example of top-down and cross-sectional views of a semiconductor structure with a disruptive region formed by a first mask, in accordance with some embodiments of the present disclosure.

FIG. 2 illustrates a schematic top-down (top) and cross-sectional views (bottom) of an exemplary semiconductor structure 200 according to some embodiments, wherein the semiconductor structure 200 having a group of 2N numbers of discontinuous mandrel line pairs 212, wherein N can be any whole number. For simplicity, two discontinuous mandrel line pairs 212 (i.e., N=1) are illustrated in FIG. 2-FIG. 9A of the present disclosure. The discontinuous mandrel line pair 212 includes two end surfaces 212e, wherein the distance between the two end surfaces 212e includes a gap with a dimension of "g".

The forming of the discontinuous mandrel line pairs 212 includes exposing a portion of the 2N numbers of adjacent mandrel lines 101 with a first mask (not shown), removing the exposed portion of the 2N numbers of mandrel lines, forming 2N numbers of discontinuous mandrel line pairs 212, and forming N numbers of intersections 214 of space lines 216 and a space channel 218, wherein the space lines 216 are parallel to the mandrel lines 101, and wherein the space channel 218 is perpendicular to the mandrel lines 101. The exposing and removing of the portion of the 2N numbers of adjacent mandrel lines 101 can use similar techniques as the patterning process for mandrel lines 101, including a similar lithography process followed by a similar etching process. The designed features on the first mask used to form 2N numbers of discontinuous mandrel line pairs 212 can have a width "g" and a length "$2N(b_1+a_1)$." Accordingly, the lithography alignment between the first mask and the semiconductor structure 200 can have a tolerance about "$b_1/2$."

In some embodiments, semiconductor structure 200 can have one or more groups of discontinues mandrel line pairs 212, and the one or more of groups can include different numbers of discontinuous mandrel line pairs 212.

The cross-sectional view of semiconductor structure 200 along line 102 is also shown in FIG. 2, wherein the portion of the 2N numbers of mandrel lines 101 is removed at the location of discontinuous mandrel line pairs 212.

Figure 3:
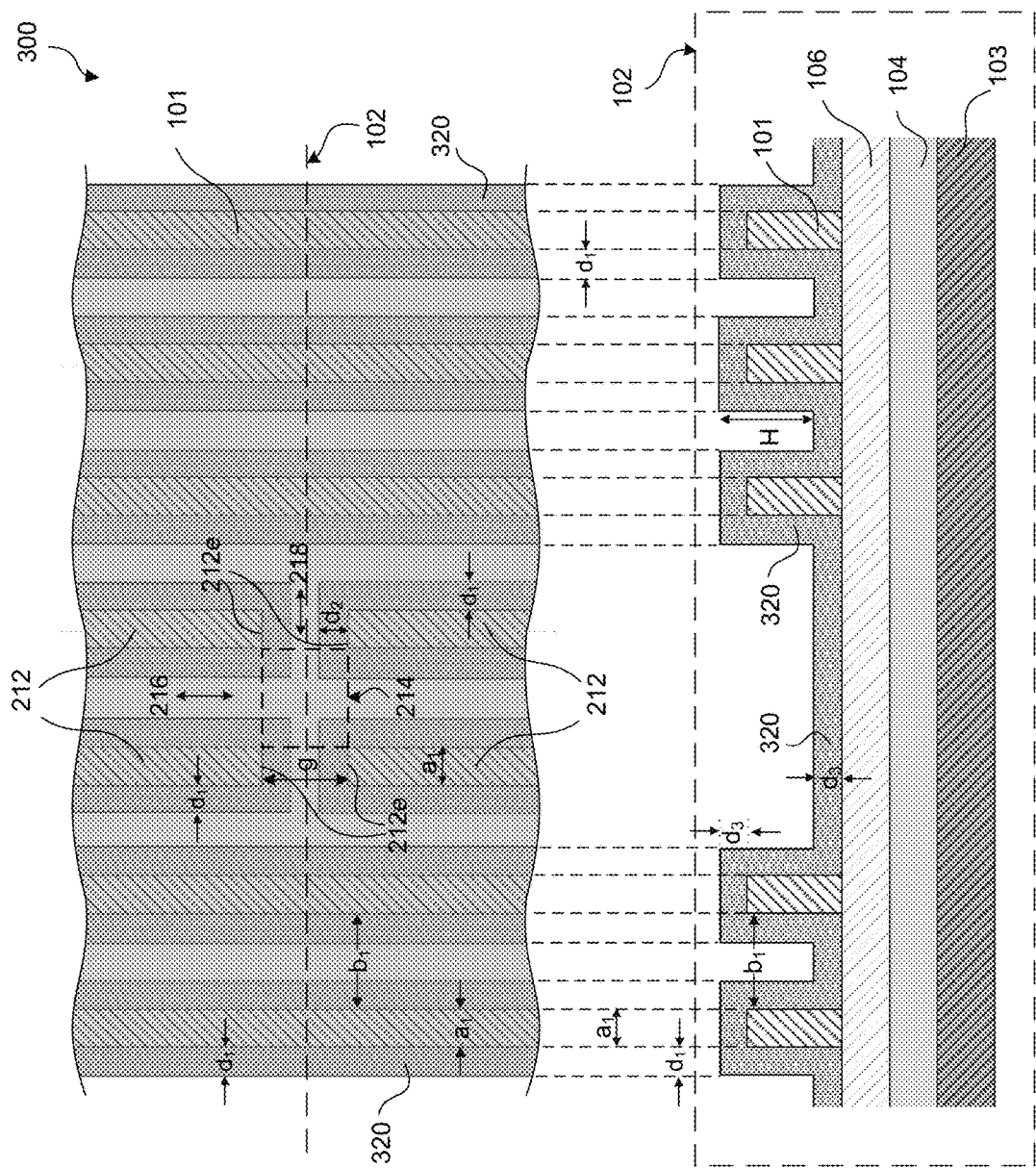
FIG. 3 illustrates an example of top-down and cross-sectional views of a semiconductor structure disposed with a second dielectric layer, in accordance with some embodiments of the present disclosure.

FIG. 3 illustrates a schematic top-down (top) and cross-sectional views (bottom) of an exemplary semiconductor structure 300 according to some embodiments, wherein a second dielectric layer 320 is disposed on the semiconductor structure 200 (in FIG. 2), covering all the surfaces of the semiconductor structure 200.

The second dielectric layer 320 can include any suitable dielectric materials that is different from the mandrel line 101, for example, silicon oxide, silicon nitride, silicon oxynitride, high-k dielectric films such as hafnium oxide, zirconium oxide, aluminum oxide, tantalum oxide, magnesium oxide, or lanthanum oxide films, and/or combinations thereof. The second dielectric layer 320 can be disposed using techniques such as CVD, PVD, PECVD, LPCVD, HDP-CVD, RTCVD, MOCVD, ALD, sputtering, thermal oxidation or nitridation, CVD using a furnace system, and/or combinations thereof.

The second dielectric layer 320 includes a thickness "$d_1$" on sidewalls of the mandrel lines 101 and the discontinuous mandrel line pairs 212. The thickness "$d_1$" of the second dielectric layer 320 depends on the profile of the sidewall of the mandrel lines 101 and the discontinuous mandrel line pairs 212, and/or the deposition technique used for the second dielectric layer 320. The second dielectric layer 320 also includes a thickness "$d_2$" on the end surfaces 212e of the discontinuous mandrel line pairs 212. The second dielectric layer 320 further includes a thickness "$d_3$" on a horizontal surface (e.g., the top of the mandrel lines 101, the discontinuous mandrel line pairs 212, and the first dielectric layer 106). The thickness "$d_1$" on the sidewalls of the mandrel lines 101 and the discontinuous mandrel line pairs 212 can be the same as the thickness "$d_3$" and "$d_2$," and in this example, the dielectric spacer is "conformal" to the mandrel lines 101 and the discontinuous mandrel line pairs 212. In some embodiments, the thickness "$d_1$" or "$d_2$" can also be larger or smaller than the thickness "$d_3$." In some embodiment, the second dielectric layer 320 includes a height equivalent to the height "H" of the mandrel lines 101 or the discontinuous mandrel line pairs 212, wherein the height "H" can be greater than the thickness "$d_3$." In some embodiments, the thickness "$d_1$" of the second dielectric layer 320 can be less than the half size of the spacing "$b_1$," such that the second dielectric layer 320 does not pinch off the spacing between two adjacent mandrel lines 101 or the discontinuous mandrel line pairs 212. In some embodiments, the thickness "$d_2$" of the second dielectric layer 320 can also be less than the half size of the gap "g," such that the second dielectric layer 320 does not pinch off the space channel 218 at the intersection 214.

Figure 4:
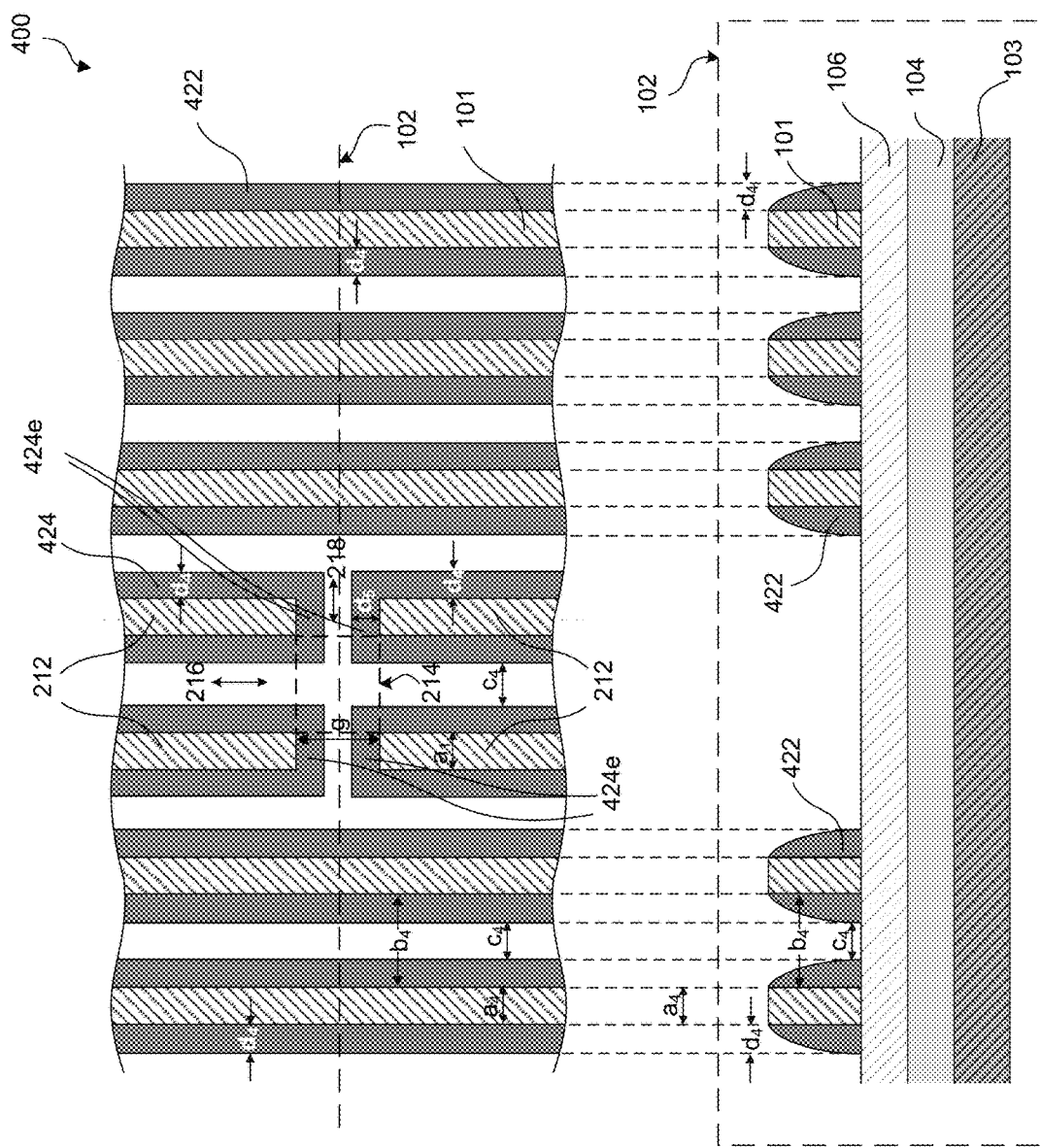
FIG. 4 illustrates an example of top-down and cross-sectional views of a semiconductor structure with dielectric spacers, in accordance with some embodiments of the present disclosure.

FIG. 4 illustrates a schematic top-down (top) and cross-sectional views (bottom) of an exemplary semiconductor structure 400 according to some embodiments, wherein dielectric spacers 422 are formed on the sidewalls of the mandrel lines 101, and wherein dielectric spacers 424 are formed on the sidewalls of the discontinuous mandrel line pairs 212. The semiconductor structure 400 also includes dielectric spacers 424e formed on the end surfaces 212e of the discontinuous mandrel line pairs 212. The forming of the dielectric spacers 422/424/424e includes an anisotropic etching process, such as RIE. In some embodiments, the second dielectric layer 320 can be silicon nitride. In this example, the RIE process includes etchant, for example, $O_2/N_2/CF_4$, $NF_3$, $CHF_3$, $C_4F_8$, and/or combinations thereof. Anisotropic RIE can include low-pressure plasma system to increase mean-free path of the ions and reduce random scattering. During anisotropic etching, the ions strike the semiconductor structure 400 in a vertical direction, perpendicular to the substrate 103. In some embodiment, the height "H" (shown in FIG. 3) of the second dielectric layer 320 can be greater than the thickness "$d_3$" on a horizontal surface (e.g., the top of the mandrel lines 101, the discontinuous mandrel line pairs 212, and the first dielectric layer 106). Therefore, the second dielectric layer 320 on a horizontal surface can be removed, while there are remaining second dielectric layers 320 on the sidewalls of the mandrel lines 101, the discontinuous mandrel line pairs 212 and the end surfaces 212e, forming the dielectric spacers 422/424 with a thickness "$d_4$," and the dielectric spacers 424e with a thickness "$d_5$." In some embodiments, the second dielectric layer thickness "$d_1$" can be the same as thickness "$d_2$" in FIG. 3. In this example, the thickness "$d_4$" of dielectric spacers 422/424 can be the same as thickness "$d_5$" of dielectric spacers 424e.

Figure 5:
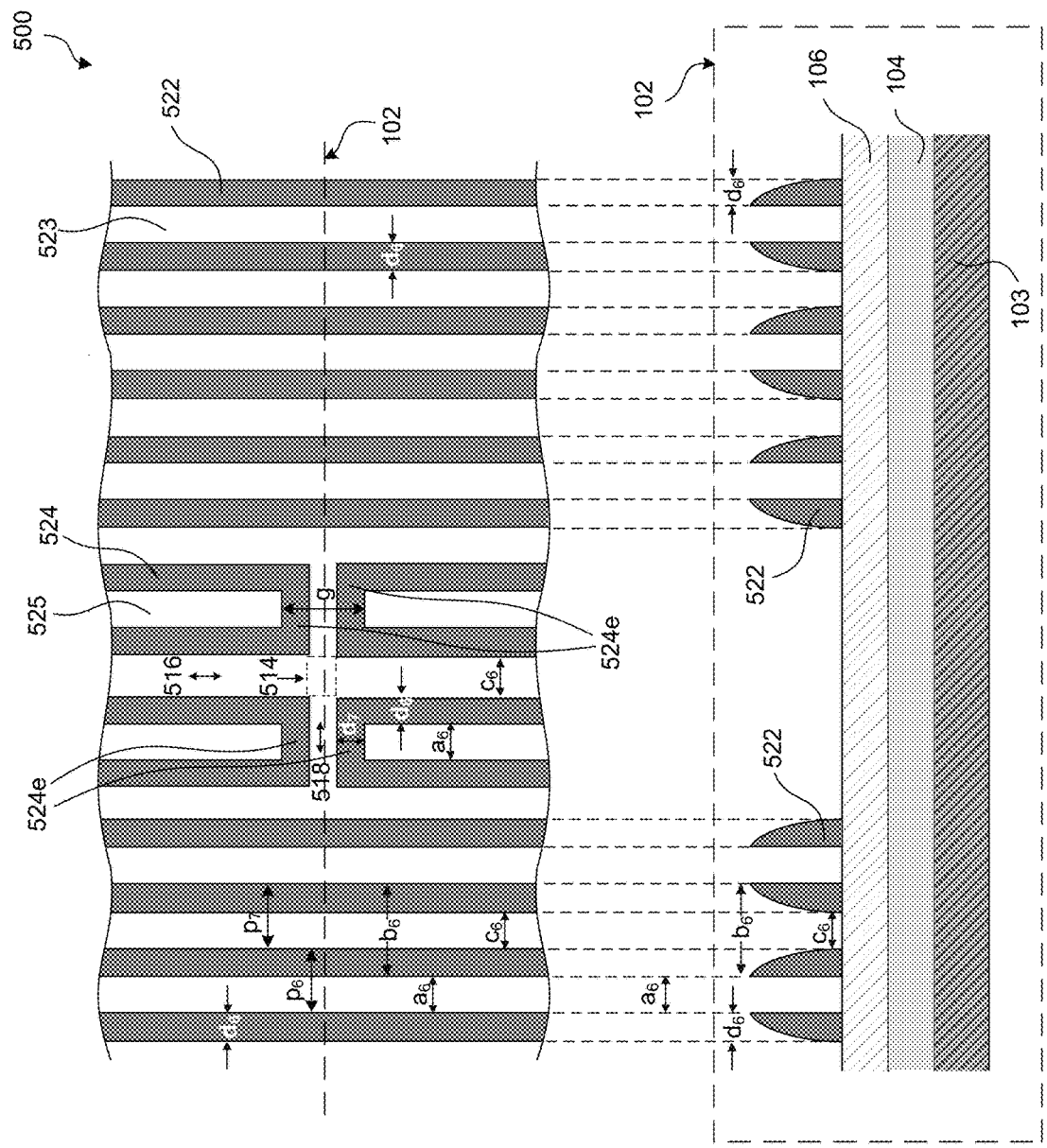
FIG. 5 illustrates an example of top-down and cross-sectional views of a semiconductor structure with spacer masks, in accordance with some embodiments of the present disclosure.

FIG. 5 illustrates a schematic top-down (top) and cross-sectional views (bottom) of an exemplary semiconductor structure 500 according to some embodiments. The forming of the semiconductor structure 500 includes removing the sacrificial material of the mandrel lines 101 and the discontinuous mandrel line pairs 212 from semiconductor structure 400 (shown in FIG. 4), leaving stand-alone dielectric spacers 522 and 524/524e (also referred to as spacer masks 522/524/524e). The spacer masks 522 refer to the stand-alone dielectric spacers formed along the mandrel lines 101, also referred to as dielectric spacer lines. The spacer masks 524/524e refer to the stand-alone dielectric spacers formed along the discontinuous mandrel line pairs 212, also referred to as discontinuous dielectric spacer lines and dielectric spacer cross-bars, wherein spacer masks 524 and 524e are parallel and perpendicular to the spacer masks 522, respectively. The semiconductor structure 500 also includes spacing 523 between two adjacent spacer masks 522 and spacing 525 between two adjacent spacer masks 524, wherein each edge of the spacing 525 is in a straight line.

The removing of sacrificial material of the mandrel lines 101 and the discontinuous mandrel line pairs 212 includes any suitable dry etching or wet etching process that is selective over the dielectric spacers 422/424/424e (in FIG. 4), e.g., etching the sacrificial material at a higher etching rate than etching the dielectric spacer 422/424/424e. In some embodiments, the dielectric spacers 422 can be silicon nitride, and the mandrel lines 101 and the discontinuous mandrel line pairs 212 can be silicon oxide. In this example, the sacrificial material of the mandrel lines 101 and the discontinuous mandrel line pairs 212 can be removed using wet chemistry, for example, hydrofluoric acid (HF) or buffered oxide etchant (BOE). The sacrificial material can also be removed by RIE using $CF_4$, $CHF_3$, $C_2F_6$, or $C_3F_6$, etc.

In some embodiments, the semiconductor structure 500 includes the spacer masks 522 having a width "$d_6$." The semiconductor structure 500 also includes the spacer masks 524 having a width "$d_6$" in the direction parallel to the spacer masks 522. The semiconductor structure 500 further includes the spacer masks 524e having a width "$d_7$" in the direction perpendicular to the spacer masks 522. The widths "$d_6$" and "$d_7$" of spacer masks 522/524/524e are determined by the dielectric spacer thickness "$d_4$" and "$d_5$," respectively. In some embodiments, the width "$d_4$" can have the same value as the width "$d_5$." In this example, the width "$d_6$" can have the same value as the width "$d_7$."

After forming the semiconductor structure 500, the spacing between two adjacent spacer masks 522 includes a spacing "$c_6$," wherein "$c_6=b_6-2d_6$," namely, spacing "$b_6$" subtracts twice the dimension of the width "$d_6$" of the spacer masks. The spacing between two adjacent spacer masks 522 also includes a spacing "$a_6$," wherein "$a_6$" is determined by the width "$a_1$" of the mandrel line 101 (in FIG. 1). The pitch of the spacer masks 522 includes pitch "$p_6$" or pitch "$p_7$." Pitch "$p_6$" refers to a sum of width "$a_6$" and width "$d_6$," i.e., "$p_6=a_6+d_6$." Pitch "$p_7$" refers to a sum of spacing "$c_6$" and width "$d_6$," i.e., "$p_7=c_6+d_6$." The sum of pitch "$p_6$" and pitch "$p_7$" is equivalent to the sum of "$a_6$" and "$b_6$," i.e., "$p_7+p_6=a_6+d_6+c_6+d_6=a_6+b_6$," which can be the same as the pitch "$p_1$" of the mandrel lines 101, wherein the pitch "$p_1$" refers to the sum of width "$a_1$" and width "$b_1$," i.e., "$p_1=a_1+b_1$." Therefore through the processes described above (e.g., sacrificial mandrel and spacer formation), the large pitch "$p_1$" of mandrel lines 101 (in FIG. 1) can be split into smaller pitches "$p_6$" and "$p_7$" (in FIG. 5). Using spacer image transfer, dense lines with small pitch can be achieved through mandrels of larger pitch.

In some embodiments, spacer masks 522/524 can have constant pitch. Constant pitch refers to the situation when pitch "$p_6$" and "$p_7$" are of the same value. Equivalent pitch "$p_6$" and pitch "$p_7$" can be formed through layout design and/or processing. In some embodiments, spacing "$a_6$" and "$c_6$" can have the same dimension, wherein "$a_6$" can be determined by the width "$a_1$" of the mandrel lines 101, and "$c_6$" can be determined by "$b_6-2d_6$," e.g., spacing of mandrel lines 101 and width of spacer mask 522. In this example, pitch "$p_6$," defined as "$p_6=a_6+d_6$," can be the same as pitch "$p_7$," defined as "$p_7=c_6+d_6$."

In some embodiments, spacer mask 522/524 can have equal line width $d_6$ and spacing $a_6$ and $c_6$, as well as constant pitch $p_6/p_7$. In this example, "$d_6=a_6=c_6$." Because, by definition, $c_6=b_6-2d_6$, accordingly, $b_6=3d_6=3a_6$. In the other words, the width $d_6$ and the spacing $a_6$ of spacer masks 522/524 can be one third of the dimension "$b_6$" of the mandrel lines 101. Because spacing $a_6$ and dimension $b_6$ can be determined by the width $a_1$ and spacing $b_1$ of mandrel lines 101 in FIG. 1, in this example, the width "$a_1$" of mandrel lines 101 can be one third of the spacing "$b_1$." For example, "$a_1$" or "$a_6$" can be designed as 20 nm, and "$b_1$" or "$b_6$" can be designed as 60 nm, while "$d_6$" can also be chosen as 20 nm after spacer mask formation. In this example, spacing "$c_6$" can be "$c_6=b_6-2d_6=20$ nm". Therefore, the semiconductor structure 500 can have equal line width and spacing of 20 nm, with a constant pitch $p_6$ and $p_7$ of 40 nm. In this example, the designed features on the first mask used to form two discontinuous mandrel line pairs 212 can have a length 160 nm, and the lithography alignment between the first mask and the semiconductor structure 200 can have a tolerance about 30 nm.

The semiconductor structures in the present disclosure can include process variations resulting from, for example, lithography, etching and/or deposition. Therefore feature sizes (e.g., width, spacing, pitch, and/or thickness) can be different from the dimensions described herein. The relationships and equations of the dimensions can be modified accordingly. These adjustments are known to those skilled in the art and are omitted for simplicity herein.

Because the spacer masks 522 are formed on the sidewalls of mandrel lines 101, the spacer masks 522 can be twice as many as the mandrel line 101. In some embodiment, the semiconductor structure 200 (FIG. 2) includes one or more groups of discontinuous mandrel line pairs 212, wherein one group includes 2N numbers of discontinuous mandrel line pairs 212 (N can be any whole number). Thereby, the semiconductor structure 400 (FIG. 4) includes 4N numbers of dielectric spacers 424 and 4N numbers of dielectric spacers 424e. Accordingly, the semiconductor structure 500 includes 4N numbers of space masks 524 and 4N numbers of spacer masks 524e. In FIGS. 2-5, N is set as 1 for illustration purpose.

The semiconductor structure 500 also includes N numbers of intersections 514 of space lines 516 and a space channel 518, wherein the space lines 516 are parallel to the spacer masks 524 and the space channel 518 is perpendicular to the spacer masks 524.

In some embodiments, the spacer masks 524 (parallel to spacer masks 522) can also have width "$d_6$" and spacing "$a_6$." Space lines 516 can have a dimension similar to spacing "$c_6$." Spacer masks 524 also include similar pitches as "$p_6$" and "$p_7$" for spacer masks 522.

The spacer masks 524e (dielectric spacer cross-bars), formed on the end surfaces 212e of discontinuous mandrel line pairs 212, include the width "$d_7$." Accordingly, space channel 518 can have a width, described as "$g-2d_7$," namely, gap "g" subtracts twice the width "$d_7$" of the spacer masks 524e.

Figure 6:
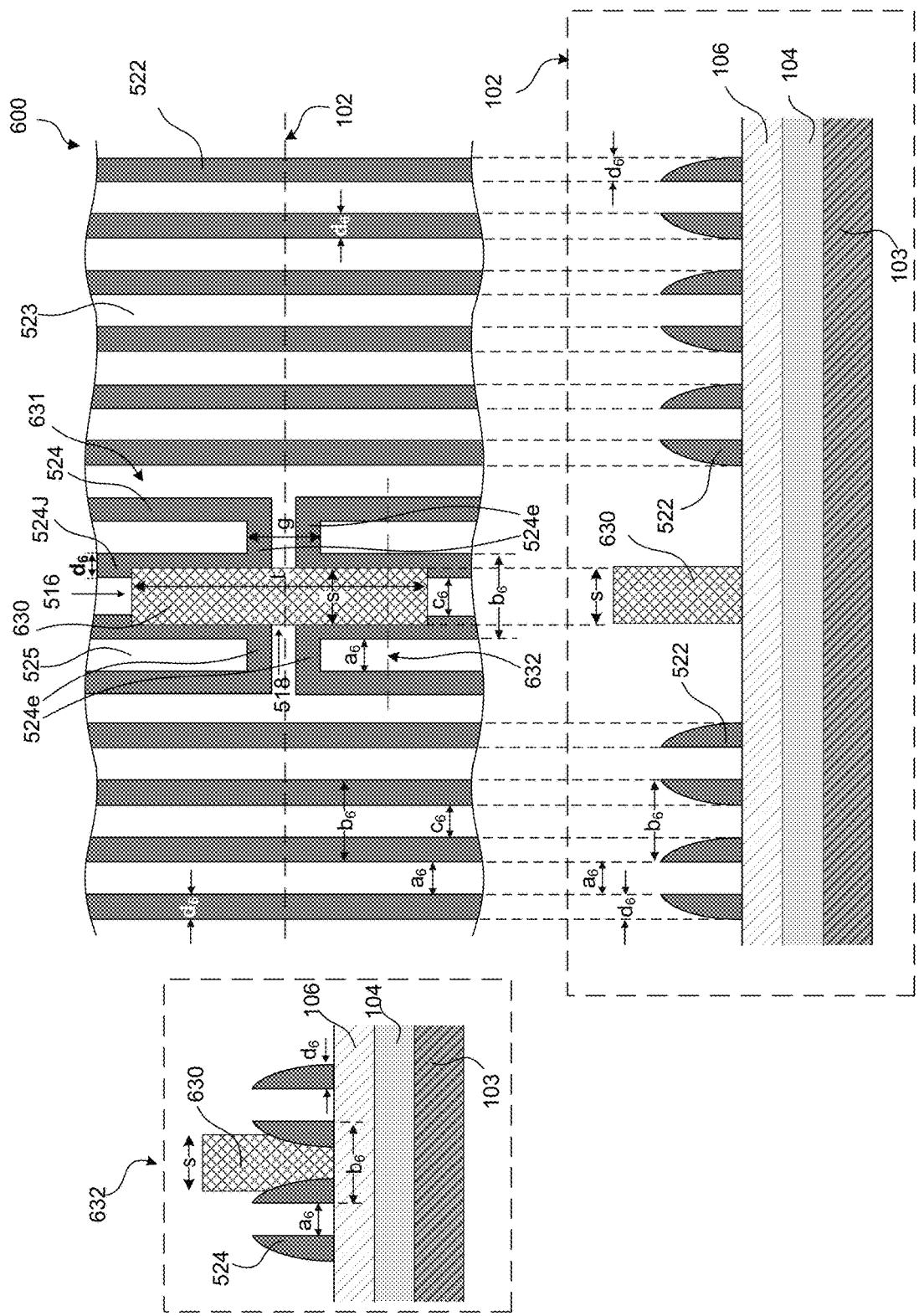
FIG. 6 illustrates an example of top-down and cross-sectional views of a semiconductor structure with a block region using a second mask, in accordance with some embodiments of the present disclosure.

FIG. 6 illustrates a schematic top-down (top) and cross-sectional views (bottom/left) of an exemplary semiconductor structure 600 according to some embodiments. The semiconductor structure 600 includes one or more groups of blocked regions 630 using a second mask (not shown), wherein the forming of each group includes disposing the second mask over the N numbers of intersections 514 (shown in FIG. 5 wherein N=1), forming N numbers of blocked regions 630, and disconnecting the corresponding space lines 516 and space channels 518. The blocked region 630 include a width "s," measured in the direction perpendicular to the spacer masks 522. The blocked region 630 also include a length "t," measured in the direction parallel to the spacer masks 522. The blocked region 630 formed by the second mask extends along the direction of the spacer masks 524 and includes at least a portion of each spacer masks 524J adjacent to the space lines 516 at the intersections 514. In some embodiments, the blocked region 630 formed by the second mask includes length "t" larger than gap "g". In some embodiments, the blocked region 630 formed by the second mask includes width "s" larger than spacing "$c_6$." The blocked region 630 formed by the second mask also includes width "s," wherein the width "s" can be less than the dimension "$b_6$." In some embodiments, the alignment tolerance of the second mask (or the blocked regions) can be less than half of the width "$d_6$" of the spacer masks 524, such that the blocked region 630 does not cover the adjacent spacing "$a_6$." In the other words, the spacing 525 is not covered by the blocked region 630. In some embodiments, the alignment tolerance of the second mask (or the blocked regions) can be less than dimension $$\frac{3d_6 + 2a_6}{2},$$

such that the blocked region 630 does not cover spacing 631 adjacent to the spacer masks 524. For example, if $a_6=d_6=c_6=20$ nm and $b_6=60$ nm, the width "s" of the blocked region 630 can be designed as 40 nm. The lithography alignment tolerance for the second mask can be as tight as 10 nm to block the space line 516, but not the other two adjacent spacing "$a_6$." The lithography alignment tolerance for the second mask can also be about 50 nm, to further block the two adjacent spacing "$a_6$", but not the spacing 631.

The cross-sectional views along line 102 and 632 are also shown, wherein the width of the blocked region seen in the cross-sectional view along line 102 is width "s," and the width of the blocked region together with the spacer mask 524 seen in the cross-sectional view along line 632 can be similar to dimension "$b_6$." The second mask used to form blocked region 630 can be a photoresist or a hard mask such as silicon oxide, silicon nitride or polymer, and can use lithography and/or patterning processes similar to the ones used for mandrel line 101.

Figure 7:
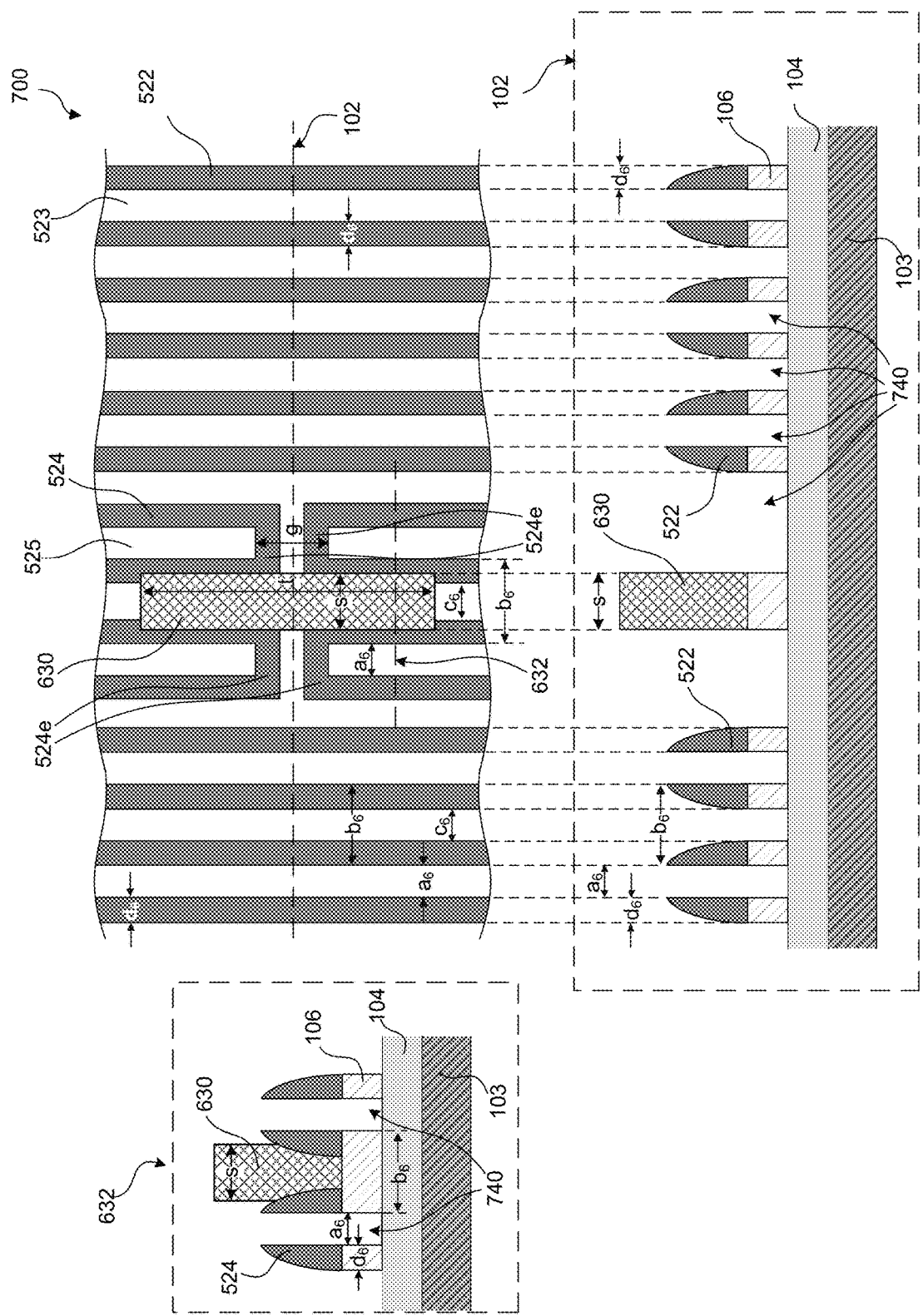
FIG. 7 illustrates an example of top-down and cross-sectional views of a semiconductor structure with openings formed in the first dielectric layer using a conjunction of a second mask and spacer masks, in accordance with some embodiments of the present disclosure.

FIG. 7 illustrates a schematic top-down (top) and cross-sectional views (bottom/left) of an exemplary semiconductor structure 700 according to some embodiments. The forming of the semiconductor structure 700 includes forming a plurality of openings 740 extended through the first dielectric layer 106 with a conjunction of spacer masks 522/524/524e and the blocked region 630 formed by the second mask. Shown in the cross-sectional views along line 102 and line 632, the openings 740 extend through the first dielectric layer 106 and expose at least a portion of the insulating layer 104. The forming of the openings 740 can include dry etching, for example, RIE. In some embodiments, the first dielectric layer 106 can be silicon oxide, and the etching of the first dielectric layer 106 can include RIE using $CF_4$, $CHF_3$, $C_2F_6$, or $C_3F_6$, etc. In some embodiments, the insulating layer 104 can be silicon nitride. In this example, the insulating layer 104 can function as an etch-stop layer during the forming of the opening 740, wherein the etch rate of the insulating layer 104 can be slower than the etch rate of the first dielectric layer 106. As previously discussed, the semiconductor structure 600 in FIG. 6 can be formed such that the blocked region 630 does not cover the adjacent spacing "$a_6$," or spacing 525. In this example, the openings 740 formed through the spacing 525 are not blocked by the blocked region 630 either (see the cross-sectional view along line 632). In the other words, adjacent to the blocked region 630, the opening 740 formed in the first dielectric layer 106 has a line shape similar to the spacing 525 in FIG. 5, which follows a line shape of the discontinuous mandrel line pair 212 in FIGS. 2 and 4.

Figure 8:
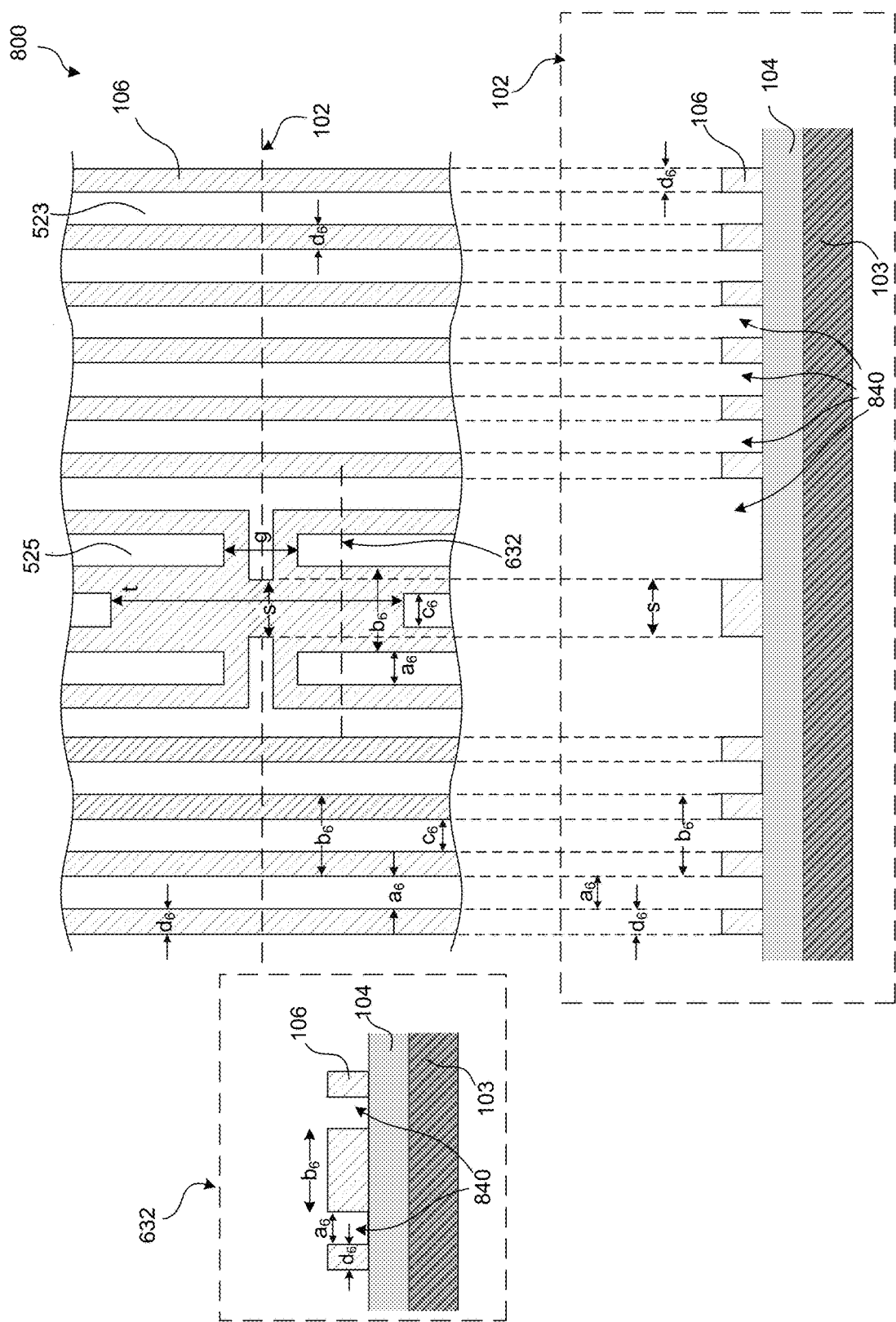
FIG. 8 illustrates an example of top-down and cross-sectional views of a semiconductor structure with openings in the first dielectric layer, in accordance with some embodiments of the present disclosure.

FIG. 8 illustrates a schematic top-down (top) and cross-sectional views (bottom/left) of an exemplary semiconductor structure 800 according to some embodiments, wherein the spacer masks 522/524/524e and the second mask are removed and the top surfaces of the first dielectric layer are exposed. The semiconductor structure 800 includes a plurality of openings 840, corresponding to the openings 740 in FIG. 7. The patterns of the spacer masks 522/524/524e and the blocked regions 630 can be transferred into the first dielectric layer 106 with similar dimensions, wherein the dimensions in the first dielectric layer 106 are also referred to as spacing "$a_6$" and "$c_6$," width "$d_6$" and "s," and dimension "$b_6$" and "t." As stated previously, the changes of the dimensions due to process variations are omitted for simplicity herein, and can be included with some modification by those skilled in the art. At the completion of this process step, the spacing 525 between the spacer masks 524 in FIG. 5 are transferred to the first dielectric layer 106 without altering its shape by selecting a desired width "s" of the blocked region 630 (in FIG. 6) and controlling of the alignment tolerance. Accordingly, the spacing 525 preserves each of its edges, which is in a straight line.

Figure 9A:
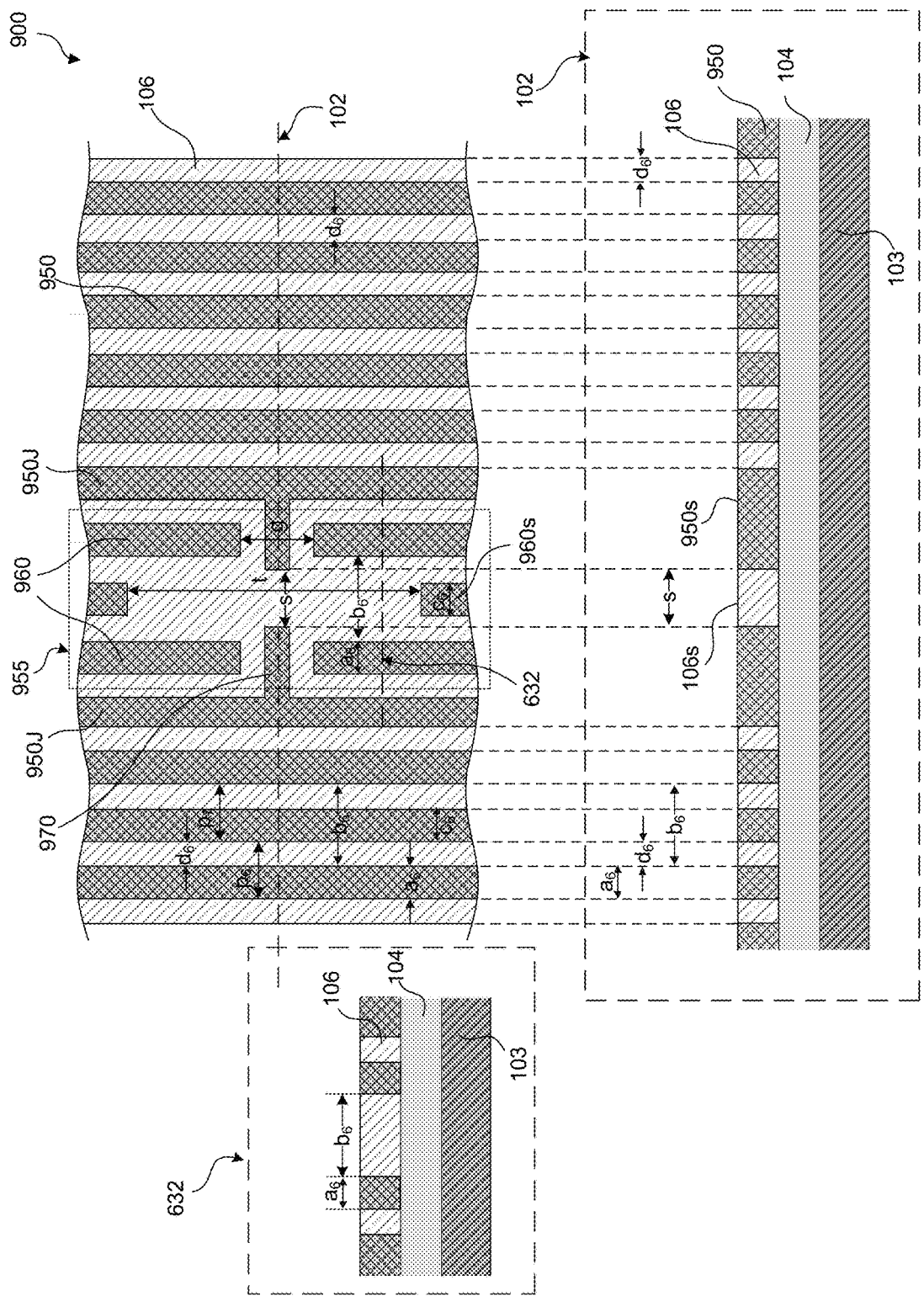
FIGS. 9A and 9B illustrate examples of top-down and cross-sectional views of semiconductor structures with objective material lines formed in the first dielectric layer, in accordance with some embodiments of the present disclosure.
Figure 9B:
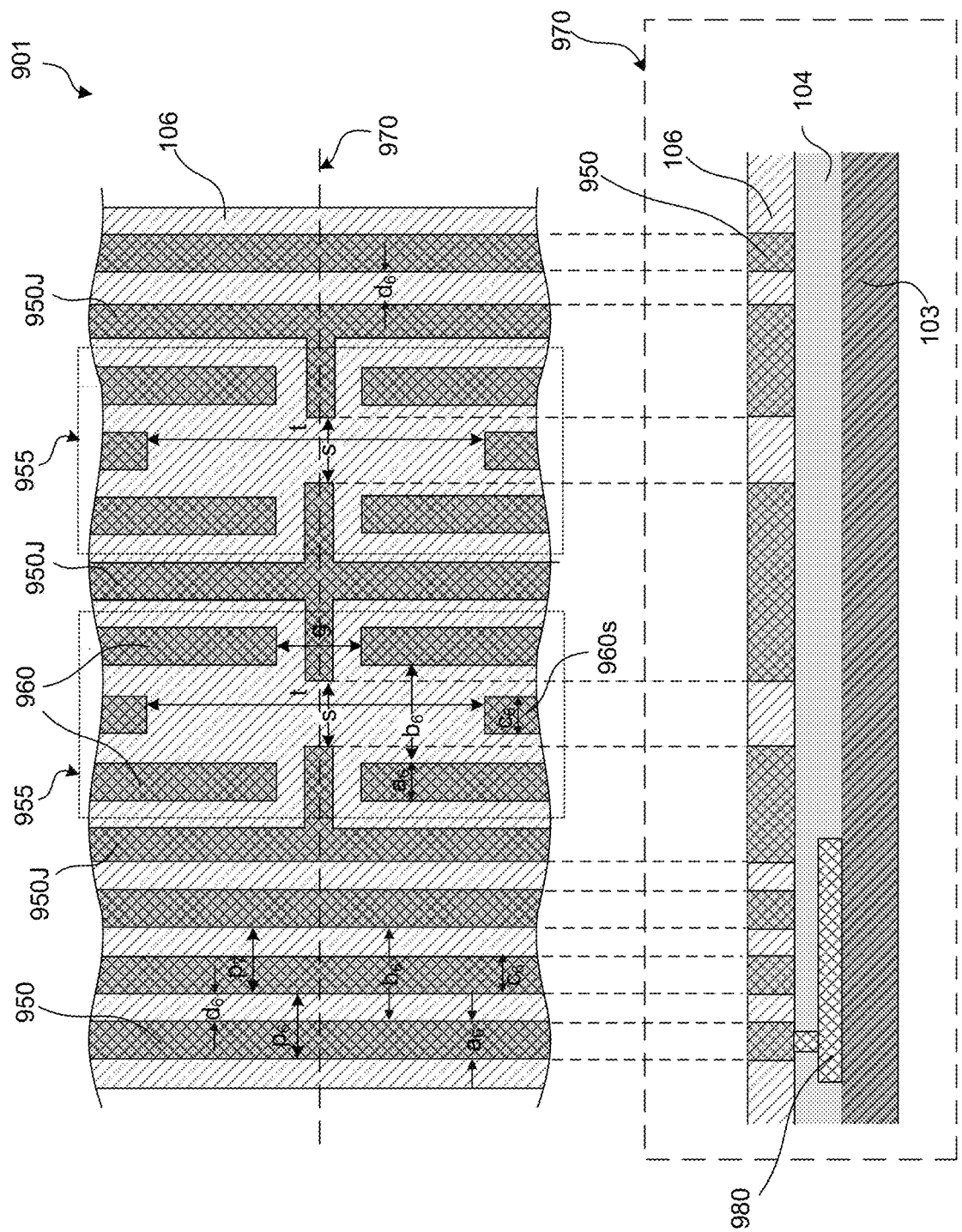

FIG. 9A illustrates a schematic top-down (top) and cross-sectional views (bottom/left) of an exemplary semiconductor structure 900 (N=1) according to some embodiments. FIG. 9B illustrates a schematic top-down of an exemplary semiconductor structure 901 (N=2) according to some embodiments. The forming of the semiconductor structures 900 and 901 include disposing an objective material in the openings 840 (in FIG. 8) and forming objective lines 950 and discontinuous line pairs 960 with top surfaces 950s coplanar with the top surface 106s of the first dielectric layer 106, wherein the forming of coplanar surfaces includes a planarization process such as chemical mechanical polishing. In some embodiments, the insulating layer 104 of the semiconductor structure 900/901 can include one or more conductive structures (e.g., a conductive structure 980 shown in FIG. 9B in a cross-sectional view along a line 102), in contact with the objective lines 950/960. In this example, the semiconductor structure 950/960 can be metal level M2 and the conductive structures in the insulating layer 104 can be metal level M1 and/or connecting via.

The objective material for objective lines 950/960 can include a semiconductor or a conductor. The conductor can include tungsten, cobalt, copper, or aluminum. The semiconductor can include silicon, silicon germanium, polycrystalline silicon, polycrystalline silicon germanium, amorphous silicon, amorphous silicon germanium, with or without doping.

In some embodiments, the semiconductor structure 900/901 includes a plurality of objective lines 950 formed in the first dielectric layer 106. The semiconductor structure 900/901 also includes one or more disruptive regions 955, wherein one disruptive region 955 includes 3N numbers of discontinuous line pairs 960/960s. In FIG. 9A, an exemplary semiconductor structure 900 with N=1 is shown, while in FIG. 9B, an exemplary semiconductor structure 901 with N=2 is shown. The semiconductor structure 900/901 further includes 2N bars 970, each intersecting perpendicularly with the objective lines 950J adjacent to the disruption region 955. The disruptive region 955 includes similar objective material and structure as objective lines 950, e.g., coplanar surfaces with the first dielectric layer 106.

In some embodiments, the objective lines 950 include a number twice as many as the mandrel lines 101. Compared with semiconductor structures 600 and 700 in FIGS. 6 and 7, the semiconductor structure 900 includes patterns appearing to be "reversed," e.g., the lines (the spacer masks 522/524/524e) of semiconductor structures 600/700 become spaces (the first dielectric layer 106 in FIGS. 9A and 9B), and the spaces (spacing "$a_6$" and "$c_6$") in FIGS. 6 and 7 become lines (objective lines 950 and discontinuous line pairs 960 in FIGS. 9A and 9B). In some embodiments, the blocked region 630 does not cover the spacing 525 in FIG. 6. In this example, the discontinuous line pair 960 corresponds to the spacing 525, having similar widths and shapes, i.e., each edge of the discontinuous line pair 960 is in a straight line, which is not altered by the blocked region 630. In the other words, the objective lines 950 and the discontinuous line pairs 960 have a line width that can be the same as spacing "$a_6$" and/or "$c_6$." The objective lines 950 and the discontinuous line pairs 960 also have a pitch that can be the same as pitch "$p_6$" or pitch "$p_7$," wherein pitch "$p_6$" can be equal to pitch "$p_7$" under the conditions discussed previously. Compared with the pitch "$p_1$" of mandrel lines, the objective lines 950 and the discontinuous line pairs 960 can have smaller pitch of "$p_6$" and "$p_7$." In some embodiments, the objective lines 950 and discontinuous line pairs 960 include a width "$a_6$" or "$c_6$" in a range between about 5 nm to 40 nm, about 10 nm to about 35 nm, about 15 nm to about 30 nm, about 19 nm to about 29 nm, or the like, and a spacing "$d_6$" in a range between about 5 nm to 40 nm, about 10 nm to about 35 nm, about 15 nm to about 30 nm, about 10 nm to about 20 nm, or the like.

In the disruptive region 955, the discontinuous line pairs 960 include a gap wherein the gap can be the gap "g" in FIG. 2 and can be determined by the first mask. The distance between two adjacent discontinuous line pairs 960 also includes a dimension similar to the dimension "$b_6$" and can be determined by the first mask. The distance between the nearest two bars can be determined by the second mask and is referred to as "s" herein. Situated in between two discontinuous line pairs 960, discontinuous line pair 960s includes a distance of "t," determined by the second mask.

Referring back to FIG. 2 and FIG. 6, a combination of the first mask (in FIG. 2) and the second mask (in FIG. 6) are used to cut dense line patterns with self-aligned double patterning (SADP) through spacer image transfer to form the semiconductor structure 900. By controlling dimensions of the first and second masks, the dense line patterns can be cut without altering line width or shapes. In the other words, the objective lines 950 and the discontinuous line pairs 960 have straight edges in the disruptive region 955, where corresponding edges are in a straight line. It is noted that the bars 970 are collinear, i.e., aligned in a straight line, because they are initially defined by the first mask in FIG. 2, and then modified by the dielectric spacers 424e in FIG. 4 and the spacer masks 524e through process steps in FIG. 5-7. Using two cutting mask, the lithography alignment tolerance or process window can be increased. With a single cutting mask, the alignment tolerance is a half of spacing "$d_6$," such that the cutting shape will not be disposed over the adjacent lines. With two cutting masks, the alignment tolerance can be increased to a half of spacing "$b_1$" of the mandrel lines for the first mask (see FIG. 2) and $$\frac{3d_6 + 2a_6}{2}$$

for the second mask (see FIG. 6).

Using a similar example described previously, "$a_1$" or "$a_6$" can be designed as 20 nm, and "$b_1$" or "$b_6$" can be designed as 60 nm. In this example, the pitch "$p_1$" of the mandrel lines 101 can be 80 nm and the alignment tolerance of the first mask to form discontinuous mandrel line pairs 212 in FIG. 2 can be 30 nm. Width "$d_6$" of spacer masks can also be chosen as 20 nm. In this example, spacing "$c_6$" therefore can also be "$c_6=b_6-2d_6=20$ nm." The semiconductor structure 900 can have equal line width "$a_6$," "$c_6$" and spacing "$d_6$" of 20 nm, with a pitch $p_6$ equal to $p_7$ of 40 nm. The alignment tolerance for the second mask can be 50 nm. Using a single cutting mask for 20 nm/20 nm line/spacing, the alignment tolerance at lithography process can be as small as 10 nm. Therefore using two cutting masks, process window can be greatly improved.

Figure 10:
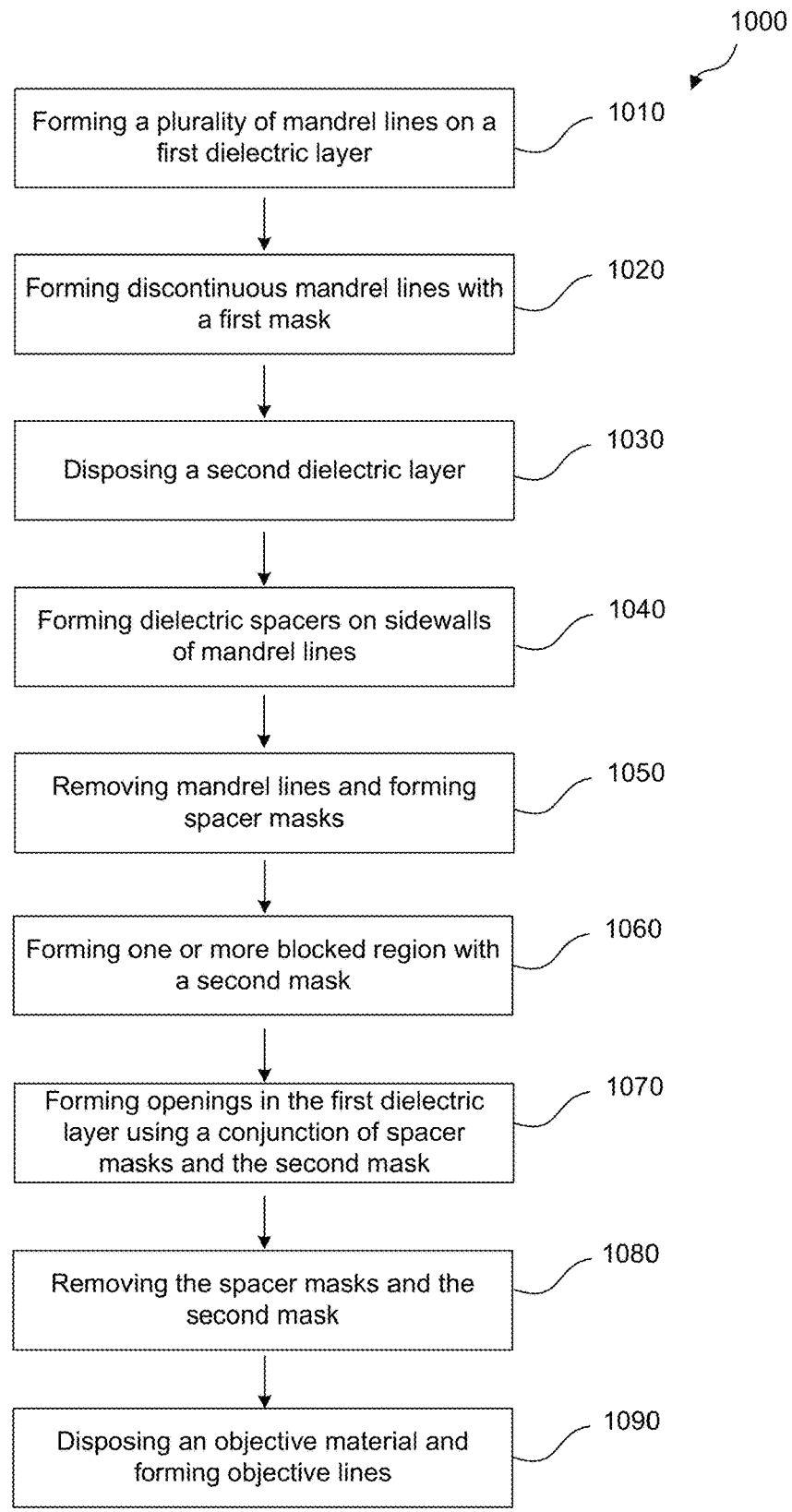
FIG. 10 illustrates an example process flow, in accordance with some embodiments of the present disclosure.

FIG. 10 illustrates an exemplary method to cut dense line patterns using self-aligned double pattering, according to some embodiments. The processing steps of the method 1000 can be used to form semiconductor structures illustrated in FIGS. 1-9B. The processing steps shown in method 1000 are not exhaustive and other processing steps can be performed as well before, after, or between any of the illustrated process steps. In some embodiments, some processing steps of exemplary method 1000 can be omitted or other processing steps not described here for simplicity can be added. In some embodiments, processing steps of method 1000 can be performed in a different order and/or vary.

At process step 1010, an insulating layer is disposed over a substrate and a first dielectric layer is disposed over the insulating layer. The substrate can be the substrate 103 in FIG. 1. Similarly, the insulating layer can be the insulating layer 104, and the first dielectric layer can be the first dielectric layer 106. The substrate, the insulating layer and the first dielectric layer can include similar materials as the substrate 103, the insulating layer 104, and the first dielectric layer 106, respectively, and can be disposed using similar techniques. The first dielectric layers can include silicon nitride, silicon oxide, silicon oxynitride or a combination thereof.

Also at process step 1010, a sacrificial material is disposed on top of the first dielectric layer. The sacrificial material can be the sacrificial material for mandrel lines 101 in FIG. 1. The sacrificial material is then patterned to form a plurality of mandrel lines on the first dielectric layer. The patterning process includes lithography and etching.

At process step 1020, one or more groups of discontinuous mandrel line pairs are formed using a first mask. The discontinuous mandrel lines can be the discontinuous mandrel line pairs 212 in FIG. 2. A group of discontinuous mandrel line pairs can include 2N numbers of discontinuous mandrel line pairs and N numbers of intersections of space lines and a space channel, wherein N can be any whole number. The forming of one group of discontinuous mandrel line pairs includes exposing a portion of 2N numbers of adjacent mandrel lines with a first mask, removing the exposed portion of 2N numbers of mandrel lines, and forming the space lines parallel to the mandrel lines and the space channel perpendicular to the mandrel lines.

At process step 1030, a second dielectric layer is disposed on the mandrel lines and discontinuous mandrel line pairs. The second dielectric layer can be the second dielectric layer 320 in FIG. 3, and can include similar materials and can be disposed by similar techniques. The second dielectric layers can include silicon nitride, silicon oxide, silicon oxynitride or a combination thereof.

At process step 1040, dielectric spacers are formed on sidewalls of the mandrel lines and discontinuous mandrel line pairs, wherein the dielectric spacers can be the dielectric spacers 422/424 in FIG. 4 and can be formed using similar techniques.

At process step 1050, the mandrel lines and discontinuous mandrel line pairs are removed to form stand-alone dielectric spacers or spacer masks. The spacer masks can be the spacer masks 522/524 in FIG. 5 and can be formed using similar techniques.

At process step 1060, one or more groups of blocked regions are formed using a second mask. The blocked regions can be the blocked regions 630 in FIG. 6 and can be formed using similar techniques. The forming of one group of blocked regions using the second mask includes disposing the second mask over the N numbers of intersections of space lines and the space channel, and disconnecting the space lines and the space channel with the blocked regions. The blocked region formed by the second mask extends along the direction of the spacer masks and includes at least a portion of each spacer masks adjacent to the space lines at the intersections. The blocked region formed by the second mask also includes a width no more than the distance between two adjacent mandrel lines. The blocked region formed by the second mask can also include a width no more than the distance between one or more discontinuous spacer mask.

At process step 1070, openings are formed in the first dielectric layer with a conjunction of spacer masks and the second mask. The openings can be the openings 740 in FIG. 7 and can be formed using similar techniques.

At process step 1080, spacer masks and the second mask are removed to expose the top surface of the first dielectric layer. The structure is similar to structure 800 in FIG. 8.

At process step 1090, an objective material is disposed in the openings and objective lines are formed with top surfaces coplanar with the top surface of the first dielectric layer. The objective lines are similar to the objective lines 950 in FIGS. 9A and 9B and can be formed using similar techniques. The objective material can include a semiconductor or a conductor. The conductor includes tungsten, cobalt, copper, or aluminum. The semiconductor includes silicon, silicon germanium, polycrystalline silicon, polycrystalline silicon germanium, amorphous silicon or amorphous silicon germanium.

The forming of objective lines in the openings with top surfaces coplanar with the top surfaces of the first dielectric layer includes a planarization process such as chemical mechanical polishing.

The objective lines include a width in a range between about 5 nm to 40 nm, about 10 nm to about 35 nm, about 15 nm to about 30 nm, about 19 nm to about 29 nm, or the like, and a spacing in a range between about 5 nm to 40 nm, about 10 nm to about 35 nm, about 15 nm to about 30 nm, about 10 nm to about 20 nm, or the like.

In some embodiments, a method for forming a semiconductor structure includes disposing an insulating layer on a substrate and disposing a first dielectric layer on top of the insulating layer. The method also includes forming a plurality of mandrel lines on the first dielectric layer. The method also includes forming one or more groups of discontinuous mandrel line pairs with a first mask, wherein each of the one or more groups includes 2N numbers of discontinuous mandrel line pairs and N numbers of intersections of space lines and a space channel, wherein N is a whole number. The method further includes disposing a second dielectric layer on the mandrel lines and discontinuous mandrel line pairs, forming dielectric spacers on sidewalls of the mandrel lines and the discontinuous mandrel line pairs, and removing the mandrel lines and the discontinuous mandrel line pairs to form spacer masks. The method also includes forming one or more groups of blocked regions using a second mask, forming openings extended through the first dielectric layer with a conjunction of spacer masks and the second mask, and removing the spacer masks and the second mask to expose top surfaces of the first dielectric layer. The method further includes disposing an objective material in the openings and forming objective lines with top surfaces coplanar with the top surfaces of the first dielectric layer.

In some embodiments, a semiconductor structure includes a plurality of objective lines formed in a first dielectric layer, and one or more disruptive regions, wherein each of the one or more disruptive regions includes 3N numbers of discontinuous line pairs and 2N bars, each intersecting perpendicularly with the objective lines adjacent to the disruption region, wherein N is a whole number.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a semiconductor structure, comprising:
    forming a plurality of mandrel lines on a first dielectric layer;
    forming, from the plurality of mandrel lines, one or more groups of discontinuous mandrel line pairs using a first mask, wherein each of the one or more groups of discontinuous mandrel line pairs comprises:
        2N discontinuous mandrel line pairs with a gap g; and
        N intersections of space lines and a space channel, wherein N is a whole number;
    forming dielectric spacers with a first width $d_6$ on sidewalls of the mandrel lines and the discontinuous mandrel line pairs to form a spacing $c_6$;
    removing the mandrel lines and the discontinuous mandrel line pairs to form spacer masks;
    forming one or more groups of blocked regions with a second width s and a length t using a second mask, wherein:
        the second width s is smaller than a sum of the spacing $c_6$ and twice the first width $d_6$, where $s<(c_6+2d_6)$; and
        the length t is larger than the gap g; and
    forming openings extending through the first dielectric layer, the spacer masks and the second mask.

2. The method of claim 1, wherein the forming the one or more groups of discontinuous mandrel line pairs further comprises:
    forming 2M discontinuous mandrel line pairs; and
    forming M intersections of space lines and the space channel,
        wherein M is a whole number different from N.

3. The method of claim 1, wherein the forming the one or more groups of discontinuous mandrel line pairs further comprises:
    exposing a portion of 2N adjacent mandrel lines; and
    removing the exposed portion of the 2N adjacent mandrel lines.

4. The method of claim 1, wherein the forming the one or more groups of discontinuous mandrel line pairs further comprises:
    forming the space lines parallel to the mandrel lines and the one or more groups of discontinuous mandrel line pairs; and
    forming the space channel perpendicular to the mandrel lines and the one or more groups of discontinuous mandrel line pairs.

5. The method of claim 1, wherein the forming the one or more groups of blocked regions using the second mask comprises:
    disposing the second mask over the N intersections of the space lines and the space channel; and
    disconnecting the space lines and the space channel with the blocked regions.

6. The method of claim 1, further comprising:
    forming second space lines and a discontinuous space line pair after removing the mandrel lines and the discontinuous mandrel line pairs.

7. The method of claim 6, wherein the forming the one or more groups of blocked regions comprises:
    extending the one or more groups of blocked regions along a direction parallel to the spacer masks; and
    aligning the one or more groups of blocked regions such that at least a portion of each of the spacer masks adjacent to each of the space lines at the intersections is covered by the one or more groups of blocked regions; and the discontinuous space line pair is not covered by the one or more groups of blocked regions.

8. The method of claim 1, further comprising:

prior to forming the dielectric spacers, disposing a second dielectric layer on the mandrel lines and the one or more groups of discontinuous mandrel line pairs.

9. The method of claim 8, wherein the disposing the second dielectric layer comprises disposing silicon nitride, silicon oxide, silicon oxynitride or a combination thereof.

10. The method of claim 1, further comprising:

after forming the openings extending through the first dielectric layer, removing the spacer masks and the second mask to expose top surfaces of the first dielectric layer.

11. The method of claim 10, further comprising:

disposing an objective material in the openings; and forming objective lines with top surfaces coplanar with the top surfaces of the first dielectric layer.

12. The method of claim 11, wherein the disposing the objective material comprises disposing a semiconductor or a conductor.

13. The method of claim 12, wherein the disposing the conductor comprises disposing tungsten, cobalt, copper, or aluminum, or a combination thereof.

14. The method of claim 12, wherein the disposing the semiconductor comprises disposing silicon, silicon germanium, polycrystalline silicon, polycrystalline silicon germanium, amorphous silicon, amorphous silicon germanium, or a combination thereof.

15. The method of claim 11, wherein the forming the objective lines comprises forming the objective lines having a third width in a range between 19 nm to 29 nm.

16. The method of claim 11, wherein the forming the objective lines comprises forming the objective lines having a second spacing in a range between 10 nm to 20 nm.

17. The method of claim 11, wherein the forming the objective lines further comprises planarizing the objective material with chemical mechanical polishing.

18. The method of claim 1, wherein the removing the mandrel lines and the discontinuous mandrel line pairs comprises dry etching or wet etching at a higher etching rate than etching the dielectric spacer.

19. The method of claim 1, further comprising:

disposing an insulating layer on a substrate; and disposing the first dielectric layer on the insulating layer.

20. The method of claim 19, wherein the disposing the first dielectric layer comprises disposing silicon nitride, silicon oxide, silicon oxynitride or a combination thereof.

* * * * *